United States Patent [19]

Luce

[11] 3,969,150

[45] July 13, 1976

[54] METHOD OF MOS TRANSISTOR MANUFACTURE

[75] Inventor: Robert L. Luce, Los Altos Hills, Calif.

[73] Assignee: Fairchild Camera and Instrument Corporation, Mountain View, Calif.

[22] Filed: Jan. 27, 1975

[21] Appl. No.: 544,445

Related U.S. Application Data

[62] Division of Ser. No. 421,195, Dec. 3, 1973, abandoned.

[52] U.S. Cl. .................................. 148/1.5; 148/187; 357/91
[51] Int. Cl.² ....................................... H01L 21/265
[58] Field of Search ................ 148/1.5, 187; 357/91

[56] References Cited
UNITED STATES PATENTS

| | | | |
|---|---|---|---|
| 3,514,845 | 6/1970 | Legat et al. | 148/187 X |
| 3,646,665 | 3/1972 | Kim | 148/187 X |
| 3,699,646 | 10/1972 | Vadasz | 148/187 |
| 3,747,203 | 7/1973 | Shannon | 148/1.5 X |
| 3,750,268 | 8/1973 | Wang | 148/187 X |

Primary Examiner—L. Dewayne Rutledge
Assistant Examiner—J. M. Davis
Attorney, Agent, or Firm—Alan H. MacPherson; Henry K. Woodward; J. Ronald Richbourg

[57] ABSTRACT

A metal-oxide-semiconductor (MOS) transistor structure includes gate, source and drain regions. Said structure also includes a gate electrode electrically connected and contiguous to either the source region or the drain region. Typically, the gate electrode is formed of a conductive material through which impurity diffusions may pass substantially unimpeded.

2 Claims, 4 Drawing Figures

METHOD OF MOS TRANSISTOR MANUFACTURE

This is a division, of application Ser. No. 421,195 filed 12/3/73, now abandoned.

BACKGROUND OF THE INVENTION

1. Field of the Invention

This invention relates to MOS transistors structures, and in particular to such structures having a gate electrode electrically connected to either a source region or a drain region.

2. Prior Art

MOS transistor structures are well known and widely used. See, for example, U.S. Pat. No. 3,673,471 issued June 27, 1972 to T. Klein, et al. entitled "Doped Semiconductor Electrodes for MOS Type Devices", and assigned to the assignee of this application. Also well known are MOS transistor structures having a gate electrode electrically connected to either a source region or a drain region, which is in turn connected, for example, to a power supply or to another circuit component.

The electrical connection within a single transistor structure between the gate electrode and the source region or between the gate electrode and the drain region has been readily accomplished with a variety of techniques. Because a polycrystalline silicon gate electrode is typically used, however, difficulties have arisen as the connections have usually been accomplished with metal. In prior art devices, that is, a first ohmic connection was formed between a first portion of a metal region and the polycrystalline silicon gate electrode, and a second ohmic connection was formed between a second portion of said metal region and either a source region or a drain region. Consequently, both a metal to polycrystalline silicon connection and a metal to source or drain region electrical connection are required. Prior art devices utilizing this structure typically have several undesirable features.

First, in a typical MOS transistor structure formed on a larger silicon wafer without external connections to other devices or to a power supply, the transistor will occupy a given area of the wafer to a given depth. In some prior art devices the ohmic connection between the metal and the polycrystalline silicon was made external to the area on the wafer which the transistor itself occupied. Thus, additional surface area on the wafer is required both because of the metal connection between the gate electrode and the source or drain region and because the connection itself must occupy some given area. Consequently, the number of devices which will fit within a given area is decreased. This is obviously undesirable as circuits formed from large numbers of such devices occupy more area than is necessary.

A second difficulty occurs when the polycrystalline silicon-metal ohmic connections are not made external to the transistor structure, but are made directly above the area occupied by the transistor gate. For reasons not well understood, but which produce results nonetheless well known, such devices frequently developed shorted gates. They were thus characterized by poor reliability and low manufacturing yields, that is, a lower than desirable ratio of usable devices to devices manufactured.

A third disadvantage of the prior art devices is that extra electrical connections are required. For example, in a transistor unconnected to any other circuit element at least two distinct connections were necessary — gate electrode to metal, and said metal to either the source region or the drain region. Ideally only a gate electrode to source region or gate electrode to drain region connection would be necessary. The extra connection in prior art devices requires extra surface area on the wafer and complicates manufacture of the devices.

In accordance with the present invention, a semiconductor structure is provided which comprises a substrate of a first conductivity type; first and second regions formed by diffusion in the substrate of opposite conductivity type from the substrate, the first region being laterally separated from the second region; a gate electrode overlying the substrate between the first and second regions and separated from the substrate by insulation, the gate electrode being extended so as to form an ohmic contact with the first region with the gate electrode being insulated from the second region.

In addition, a method of manufacturing a semiconductor structure is provided which comprises the steps of forming an insulating layer over the surface of a semiconductor substrate; defining and etching a first opening in the insulating layer thereby exposing a first area of the surface of the substrate; forming a layer of polycrystalline silicon over the insulating layer and within the first opening; defining and etching an opening in the polycrystalline silicon layer over the first area thereby exposing a portion of the first area such that a portion of the polycrystalline silicon layer remains in contact with the surface of the substrate; defining and etching a second opening in both the insulating layer and the polycrystalline silicon layer thereby exposing a second area of the surface of the substrate; diffusing an impurity into the structure thereby rendering the polycrystalline silicon layer conductive as a gate electrode, and thereby forming first and second regions in the substrate beneath the first and second areas of the surface of the substrate, wherein the gate electrode is formed in ohmic contact with the first region and is insulated from the second region.

SUMMARY OF THE INVENTION

This invention circumvents the difficulties of the prior art by providing a direct connection, that is, one without intervening metal connections, between the gate electrode and the source or drain region. Thus the gate electrode-drain region connection or gate electrode-source region connection is accomplished without the necessity of utilizing surface area of the wafer external to the transistor structure itself. The invention also avoids forming any low reliability connection of metal to polycrystalline silicon gate electrode directly over the gate region. Further, by eliminating the intervening metal connections this invention reduces the number of electrical connections necessary within a given transistor from two to one.

DETAILED DESCRIPTION OF THE INVENTION

Figure 1:
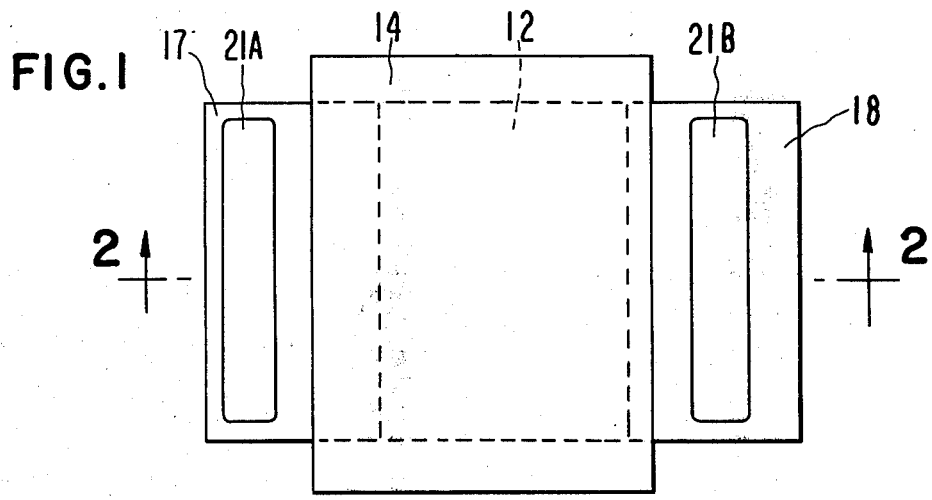
FIG. 1 is a top view of the invention showing source, drain, and gate regions.
Figure 2:
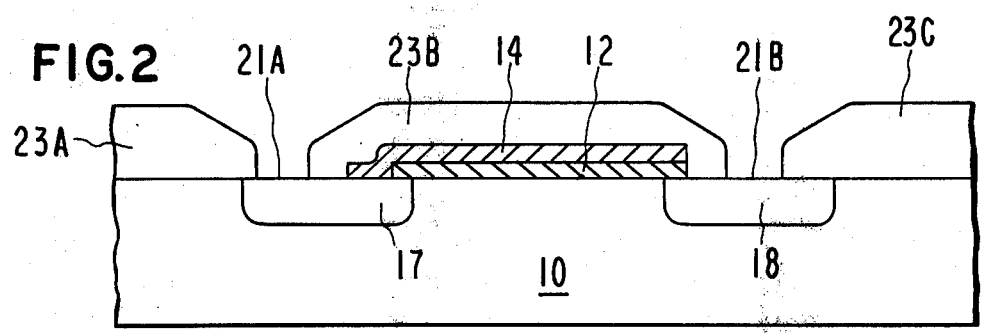
FIG. 2 is a cross-sectional view of the invention showing source, drain, and gate regions.

Referring now to FIG. 1 and FIG. 2, there is shown a top view of the invention and a cross-sectional view of the invention, respectively. Onto a semiconductor substrate 10 is deposited a thin layer of insulating material 12 which may be referred to as gate oxide. In one embodiment of the invention the semiconductor substrate 10 is N conductivity type semiconductor material, while the insulating material 12 is silicon dioxide. Contiguous and immediately above with the insulating material 12, there is formed a gate electrode 14. Gate electrode 14 will be formed of an electrically-conductive material, typically polycrystalline silicon; however, it should be understood that other electrically-conductive materials possessing certain of the to-be-described characteristics of polycrystalline can also be used for the gate electrode. The gate electrode preferably is transparent to impurity diffusion; that is, preferably the gate electrode will allow whatever impurities are chosen to form source region 17 and drain region 18 to pass through it substantially unhindered.

Source region 17 and drain region 18 are both formed from semiconductor material of opposite conductivity type to substrate region 10. For example, if substrate region 10 is N type, then source region 17 and drain region 18 will be P type. Region 17 is referred to as a source region only for illustrative purposes. It should be clear that source region 17 could as easily be a drain region, while drain region 18 could be a source region. The selection of which region is the source and which region is the drain will depend upon the external electrical connections to the transistor structure shown in FIGS. 1 and 2. Specifically, the term source region will refer to whichever of the two regions 17 and 18 is at a greater electrical potential.

External electrical contacts to the transistor structure of FIGS. 1 and 2 will typically be accomplished by first metal overlying and in contact with a part of source region 17 at surface 21A and second metal overlying and in contact with a part of drain region 18 at surface 21B. Protective insulation 23A, 23B, 23C will typically be formed over a substantial portion of the transistor structure. This insulation can be silicon dioxide; however, any material which is not electrically conductive can be used.

Referring to FIG. 1, the gate region is that region which is disposed directly beneath (as shown in FIG. 2) both the gate electrode 14 and the insulating material 12. It must also be disposed between source region 17 and drain region 18 (as shown in FIG. 1).

Figure 3:
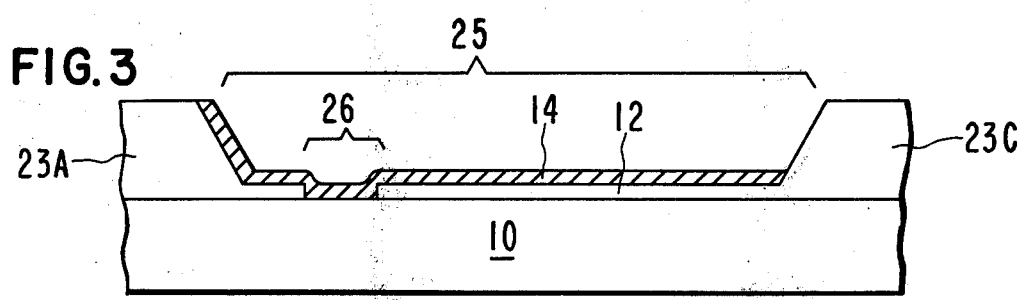
FIG. 3 and FIG. 4 depict one method of fabricating the transistor structure of this invention.
Figure 4:
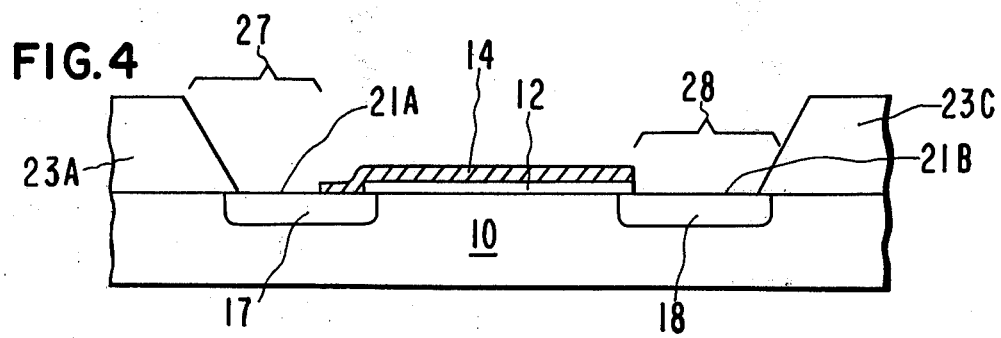

One method of fabrication of the invention can be described with reference to FIGS. 3 and 4. This process is as follows:

1. Insulating material 23A, 23C (typically referred to as field oxide) is formed across the surface of substrate 10, and then removed in region 25 from the surface of substrate 10. (FIG. 3).

2. Insulating material 12 (typically referred to as gate oxide) is formed across the surface of substrate 10 in region 25, and on top of insulating material 23. (FIG. 3.)

3. Insulating material 12 is removed from region 26. (FIG. 3.)

4. Gate electrode 14 typically formed from polycrystalline silicon) is formed in region 25. Note that it contacts substrate 10 within region 26. (FIG. 3.)

5. Gate electrode 14 and insulating material 12 are removed from the surface of substrate 10 at regions 27 and 28. (FIG. 4.)

6. Region 17 and region 18 are formed in semiconductor substrate 10, typically by a diffusion process. (FIG. 4.) Region 17 and region 18 have a conductivity type opposite that of substrate region 10.

7. Additional insulating material (not shown) is formed across the surface of the structure.

8. Provision for electrical connections to regions 17 and 18 is made by removing insulating material from the surface of the structure at surfaces 21A and 21B (FIG. 2). The electrical connection to the gate electrode-source region or to the gate electrode-drain region can be made by forming conductive material at either surface 21A or at any suitable location on the surface of gate electrode 14.

As a feature of this invention region 17 is formed both beneath the exposed surface of substrate 10 in region 27 and beneath the extension 14A of polycrystalline silicon gate electrode 14. Thus the gate electrode is in electrical contact with and at the same potential as region 17. This has been achieved without any substantial change in the channel dimensions of the resulting MOS transistor and with fewer electrical contacts than used in the prior art.

The resulting structure can thus be made with a higher yield than prior art structures and is more reliable in operation. In addition, the possibility of the formation of unwanted inversion regions in the field of the device due to the gate-to-source-or-drain region connection of the prior art is avoided. This is all achieved as a result of the discovery that the extension of the polycrystalline gate electrode over the to-be-formed region 17, for example, does not substantially affect the size of region 17.

I claim:

1. A method of manufacturing a semiconductor structure having spaced diffused regions for source and drain elements and a gate region therebetween, said gate region including an overlying electrode insulatively spaced therefrom and ohmically connected to one of said diffused regions, comprising the steps of:
   a. forming an insulating layer over the surface of a semiconductor substrate including the area for said structure;
   b. defining and etching a first opening in said insulating layer thereby exposing a first area of the surface of said substrate for a first of said diffused regions;
   c. forming a layer of polycrystalline silicon over said insulating layer and within said first opening;
   d. defining and etching said polycrystalline silicon layer over said first area thereby exposing a portion of said first area such that a portion of said polycrystalline silicon layer remains in contact with the surface of said substrate and the remainder of said polycrystalline silicon layer extends from said first area over said insulating layer adjacent to said first area;
   e. defining and etching a second opening in said insulating layer adjacent to said polycrystalline silicon layer and spaced from said first area thereby exposing a second area of the surface of said substrate;
   f. diffusing an impurity into the structure thereby rendering said polycrystalline silicon layer conductive as a gate electrode, and thereby forming said first and second diffused regions in said substrate beneath said first and second areas of the surface of said substrate, wherein said gate electrode is formed in ohmic contact with said first region.

2. A method as in claim 1 wherein said diffusion step is performed by means of ion implantation.

* * * * *

UNITED STATES PATENT OFFICE
CERTIFICATE OF CORRECTION

PATENT NO. : 3,969,150
DATED : July 13, 1976
INVENTOR(S) : Robert L. Luce

It is certified that error appears in the above-identified patent and that said Letters Patent are hereby corrected as shown below:

IN THE SPECIFICATION

Col. 2, between lines 8 and 9, insert the heading -- SUMMARY OF THE INVENTION -- .

line 45, delete the heading "SUMMARY OF THE INVENTION".

Signed and Sealed this

First Day of April 1980

[SEAL]

Attest:

SIDNEY A. DIAMOND

*Attesting Officer*    *Commissioner of Patents and Trademarks*